United States Patent [19]
Ogiso et al.

[11] Patent Number: 5,903,086
[45] Date of Patent: May 11, 1999

[54] PIEZOELECTRIC TRANSFORMER

[75] Inventors: Koji Ogiso, Moriyami; Akira Ando, Omihachiman, both of Japan

[73] Assignee: Murata Manufacturing Co., Ltd., Kyoto-fu, Japan

[21] Appl. No.: 08/801,904

[22] Filed: Feb. 14, 1997

[30] Foreign Application Priority Data

Feb. 14, 1996 [JP] Japan ..................................... 8-026920

[51] Int. Cl.$^6$ ................................................. H01L 41/08
[52] U.S. Cl. ........................................... 310/359; 310/366
[58] Field of Search ...................................... 310/359, 357

[56] References Cited

U.S. PATENT DOCUMENTS 3,549,913 12/1970 Moriki et al. ............................ 310/359
5,440,195 8/1995 Ohnishi et al. ......................... 310/359

Primary Examiner—Mark O. Budd
Attorney, Agent, or Firm—Graham & James LLP

[57] ABSTRACT

A piezoelectric transformer has a plate shaped piezoelectric member including a driving section disposed at one portion of the piezoelectric member including one end thereof and a power-generating section at the other portion of the piezoelectric member including the other end thereof. The driving section includes driving electrodes and a portion of the piezoelectric member which is polarized in the thickness direction. The power-generating section includes a power-generating electrode and a portion of the piezoelectric member polarized in the longitudinal direction. At least one polarization electrode which is exposed in part on a surface of the piezoelectric member is provided between the driving section and the power-generating electrode. The degree of polarization in a portion of the power generating section located between the driving section and the at least one polarization electrode is lower than the degree of polarization in a portion of the power generating section located between the power-generating electrode and the at least one polarization electrode.

14 Claims, 3 Drawing Sheets

PIEZOELECTRIC TRANSFORMER

BACKGROUND OF THE INVENTION

1. Field of the Invention

The present invention relates to piezoelectric transformers which use piezoelectric members.

2. Description of the Related Art

A piezoelectric transformer includes an elongated plate-type piezoelectric member including first and second electrodes disposed opposite to each other in a thickness direction of the piezoelectric member. The first and second electrodes are disposed on a first portion of the piezoelectric member at a first end in a longitudinal direction of the piezoelectric member. The piezoelectric member is polarized in a thickness direction at the first portion of the piezoelectric member at which the first and second electrodes are disposed. A third electrode is located on the end surface of a second portion of the piezoelectric member including a second end disposed opposite to the first end in the longitudinal direction, and the piezoelectric member is polarized in the longitudinal direction at the second portion at which the third electrode is located. The first portion having the first and second electrodes disposed opposite to each other in the thickness direction functions as a driving section or an input section. The second portion functions as a power generating section or an output section.

When an input voltage having a natural frequency determined by the dimension of the piezoelectric member in the longitudinal direction is applied between the electrodes of the driving section, which are disposed at the first portion of the piezoelectric member, the piezoelectric member generates strong mechanical vibration in the longitudinal direction due to an electrical deformation effect. Then, the piezoelectric member generates charges at the second portion functioning as the power generating section due to the piezoelectric effect. These charges flow as an alternating high voltage between one of the first and second electrodes in the driving section and the third electrode of the power generating section. In this way, the piezoelectric transformer causes a voltage rise through a conversion from electrical energy to mechanical energy and then a conversion from the mechanical energy to electrical energy.

In such a piezoelectric transformer, a piezoelectric ceramic material such as lead zirconate titanate is usually used to form the piezoelectric member.

As a piezoelectric transformer having a relatively large voltage-rise ratio, a laminated piezoelectric transformer has been proposed. The laminated piezoelectric transformer has a piezoelectric member made up of a laminated-layer member including a plurality of piezoelectric ceramic layers. A plurality of driving electrodes serving as input electrodes are formed such that an electrode opposes an adjacent electrode or adjacent electrodes through the piezoelectric ceramic. On external surfaces of the laminated-layer member, driving terminal electrodes and a power-generating terminal electrode are located. A plurality of driving electrodes are alternately and electrically connected to the opposite terminal electrodes. The power-generating terminal electrode serves as an output electrode.

Since the driving section and the power-generating section are polarized by using electrodes extending in the thickness and longitudinal directions for input and output in the above-described piezoelectric transformer, the degree of polarization is uniform both in the driving section and the power-generating section.

As a result of this arrangement, internal stress is generated at the boundary between the driving section and the power-generating section, in which the directions of polarization differ. The internal stress may cause the piezoelectric member to be destroyed when polarized or one or more small cracks in the piezoelectric member may occur as a result of polarization thereby reducing the mechanical strength of the piezoelectric member.

SUMMARY OF THE INVENTION

The preferred embodiments of the present invention provide a piezoelectric transformer having superior mechanical strength, in which the generation of small cracks and the destruction of the piezoelectric member caused by generation of internal stress resulting from polarization are prevented.

According to at least one preferred embodiment of the present invention, a piezoelectric transformer includes a plate-shaped piezoelectric member forming a unitary, integral device which includes a driving section having driving electrodes and a first portion of the piezoelectric member which is polarized in a thickness direction thereof and which includes a first end of the piezoelectric member and a power-generating section including a power-generating electrode and a second portion of the piezoelectric member which is polarized in the longitudinal direction and which includes a second end of the piezoelectric member, wherein at least one polarization electrode which is exposed at least in part on a surface of the piezoelectric member is provided between the driving section and the power-generating electrode, and a degree of polarization in a portion of the power generating section located between the driving section and the at least one polarization electrode is lower than a degree of polarization in a portion of the power generating section located between the power-generating electrode and the at least one polarization electrode.

At least one polarization electrode provided between the driving section and the power-generating electrode may be arranged substantially perpendicularly to a direction of polarization in the power-generating section.

At least one set of electrodes stacked in the thickness direction having piezoelectric layers disposed therebetween may be formed in parallel between the driving section and the power-generating electrode.

A single polarization electrode may be disposed between the driving section and the power generating electrode. Alternatively a plurality of polarization electrodes can be disposed between the piezoelectric layers of the piezoelectric member such that the plurality of polarization electrodes are spaced from each other in the longitudinal direction of the piezoelectric member.

The piezoelectric member may be made up of ceramic or other suitable piezoelectric material.

According to the preferred embodiments of the present invention, because polarization electrodes are provided between the driving section and the power-generating electrode and thereby, the piezoelectric member is polarized such that the degree of polarization in a portion of the power generating section located between the driving section and the polarization electrode located closest to the driving section is lower than a degree of polarization in a portion of the power generating section located between the power-generating electrode and the polarization electrode located closest to the driving section, the generation of small cracks and the destruction of the piezoelectric member due to internal stress during polarization are prevented. Therefore, a piezoelectric transformer having superior mechanical strength is obtained.

These and other elements, features and advantages of the preferred embodiments of the present invention will be apparent from the following detailed description of the preferred embodiments of the present invention, as illustrated in the accompanying drawings.

DESCRIPTION OF PREFERRED EMBODIMENTS

Figure 1:
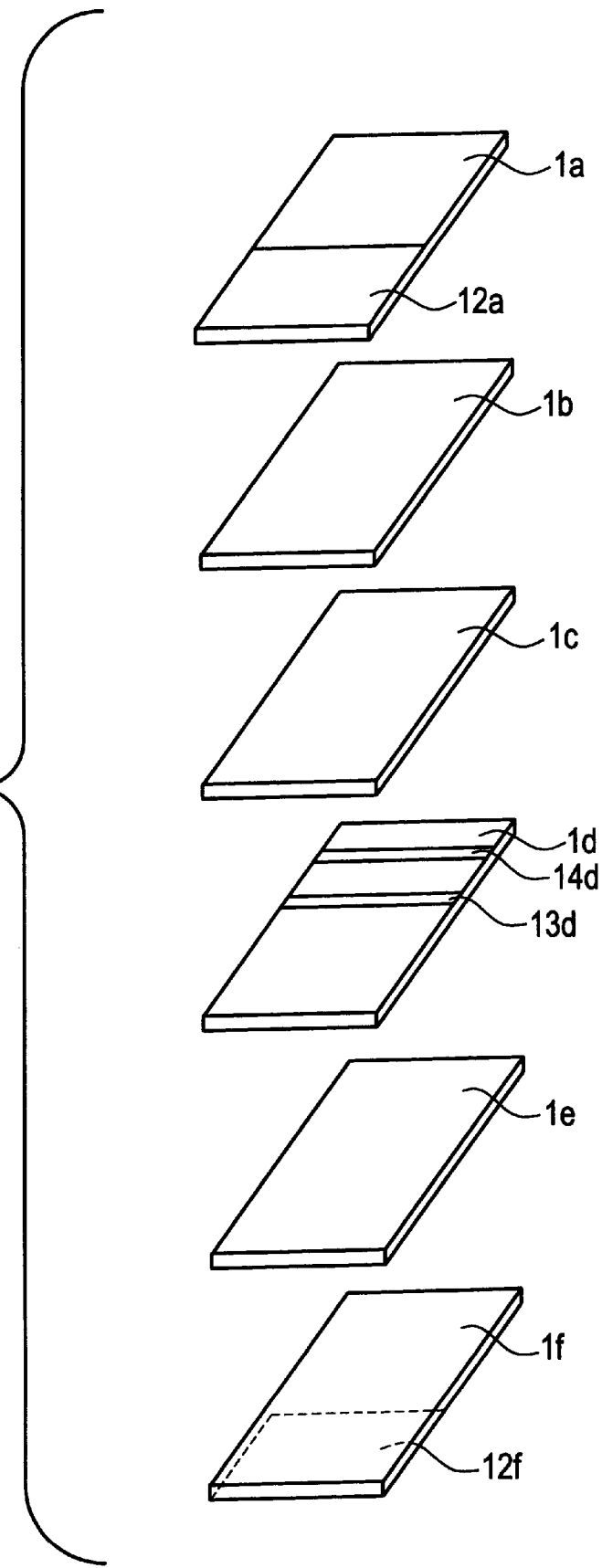
FIG. 1 is an exploded, perspective view of an unsintered laminated green sheet unit used in a piezoelectric transformer according to a preferred embodiment of the present invention.

Piezoelectric transformers according to preferred embodiments of the present invention will be described below by referring to the drawings.

FIRST PREFERRED EMBODIMENT

Figure 2:
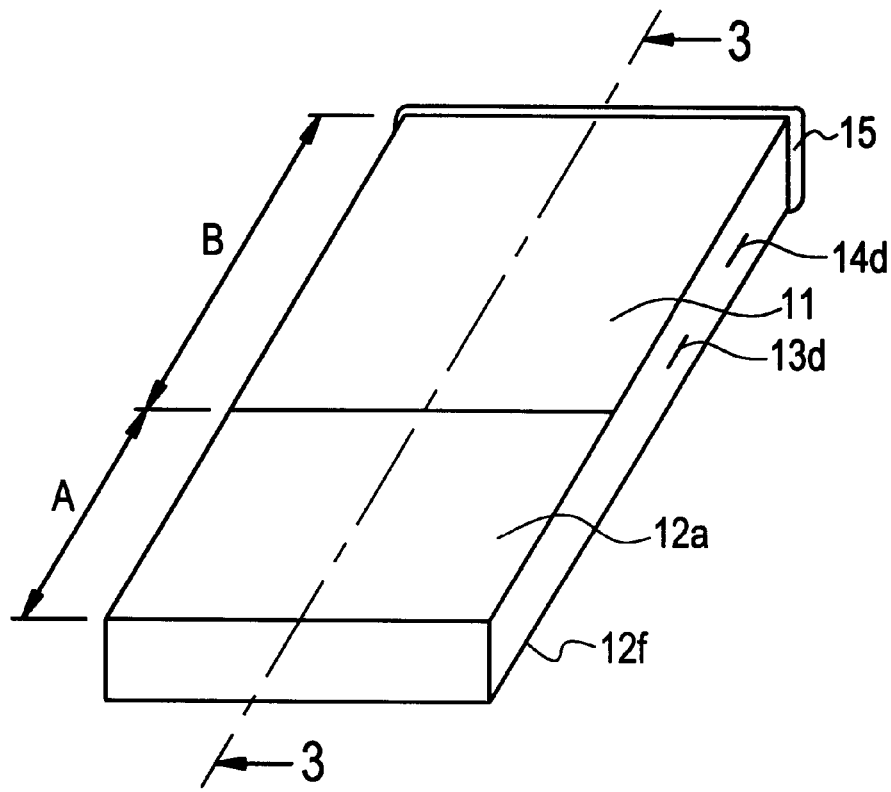
FIG. 2 is a perspective view of a piezoelectric transformer having the laminated green sheet unit shown in FIG. 1.

FIG. 1 is an exploded, perspective view of an unsintered laminated green sheet unit used in a piezoelectric transformer in which a piezoelectric member is preferably made of ceramic, according to a preferred embodiment of the present invention. In FIGS. 1 and 2, there are shown green sheets 1a, 1b, 1c, 1d, 1e, and 1f made up of a piezoelectric material, driving electrodes 12a and 12f, and electrodes 13d and 14d disposed between the driving electrodes 12a and 12f and a power-generating electrode 15. The electrodes are also assigned the same symbols after the piezoelectric member is sintered.

FIG. 2 is a perspective view of a piezoelectric transformer 10 having the laminated green sheet unit shown in FIG. 1. In FIG. 2, there is shown a piezoelectric member 11, the power-generating electrode 15, a driving section A, and a power-generating section B. Since the other portions are the same as those shown in FIG. 1, the same reference numerals used in FIG. 1 are used in FIG. 2 and the description thereof is omitted.

Figure 3:
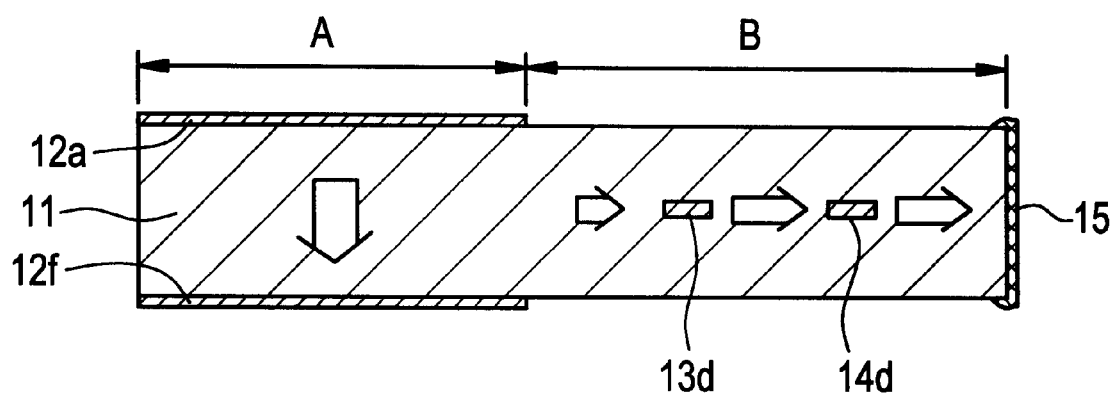
FIG. 3 is a cross section taken along plane X–Y of the piezoelectric transformer shown in FIG. 2.

FIG. 3 is a cross section taken along plane X–Y of the piezoelectric transformer 10 shown in FIG. 2. Since each portion is the same as that shown in FIGS. 1 and 2, the same reference numerals used in FIGS. 1 and 2 are used in FIG. 3 and the description thereof is omitted.

A preferred method of manufacturing the piezoelectric transformer 10 shown in FIGS. 2 and 3 will be described below by referring to FIG. 1.

The green sheets 1a, 1b, 1c, 1d, 1e, and 1f made of a piezoelectric material are first prepared. The green sheets 1a–1f are preferably made by mixing Pb(Zr, Ti)O$_3$ ceramic powder with a binder and a solvent to make a paste and the sheets are prepared preferably using a known doctor blade method.

At a portion including one end on the front surface of the green sheet 1a, a substantially rectangular driving electrode 12a is formed preferably by a screen printing method with the use of conductive paste having Ag/Pd as an electrically conductive component. In the same way, approximately-I-shaped electrodes 13d and 14d which extend to both sides of the green sheet id are disposed substantially perpendicularly to the longitudinal direction of the green sheet 1d on a portion of the sheet id including the other end on the front surface of the green sheet 1d. The substantially rectangular driving electrode 12f is also preferably formed by a screen printing method at a portion of the sheet if opposing the electrode 12a on the rear surface of the green sheet 1f.

As shown in FIG. 1, the green sheets 1f, 1e, 1d, 1c, 1b, and 1a are stacked and pressed to form a laminated green sheet unit.

The laminated green sheet unit is then sintered preferably at about 1,100° C. to form the piezoelectric member 11 having electrodes on the inside and outside as shown in FIG. 2. With the use of conductive paste preferably having Ag as the main component, the power-generating electrode 15 is formed on the end surface opposite the end surface near where the driving electrodes 12a and 12f of the piezoelectric member 11 are disposed.

Next, the piezoelectric member obtained as described above is polarized in silicone oil. An electric field is applied between the driving electrodes 12a and 12f so that the piezoelectric member is polarized in a thickness direction until the degree of polarization has reached saturation.

Between one electrode made by electrically short-circuiting the driving electrodes 12a and 12f, and the electrode 13d, an electric field is applied. The piezoelectric member is preferably polarized in the longitudinal direction to such an extent that the degree of polarization in the piezoelectric member does not reach saturation.

An electric field is also applied between the electrodes 13d and 14d. The piezoelectric member is polarized in the longitudinal direction until the degree of polarization in the piezoelectric member reaches saturation. The direction of polarization is the same as that for the polarization between the one electrode made by electrically short-circuiting the driving electrodes 12a and 12f, and the electrode 13d. In the same way, the piezoelectric member is polarized between the electrodes 14d and 15 until the degree of polarization reaches saturation.

As described above, the piezoelectric transformer 10 according to the preferred embodiments of the present invention is obtained such that the degree of polarization at a portion between the driving section and the electrode 13d, which is the electrode closest to the driving section among the electrodes, 13d, 14d, located in the power-generating section, is lower than a degree of polarization between the power-generating electrode 15 and the electrode 13d. In one example, the piezoelectric transformer 10 measures approximately 40 mm by 20 mm by 2 mm.

Mechanical strength of the example piezoelectric transformer 10 constructed according to the preferred embodiments of the present invention and breakage-resistance strength of ten units for the piezoelectric transformer were measured in the thickness direction. The obtained data was plotted on Weibull probability paper to obtain the mean breaking strength ($\mu$) and form factor (m). Table 1 shows the results.

SECOND PREFERRED EMBODIMENT

In the same way as in the first preferred embodiment, a piezoelectric transformer is prepared in which two sets of electrodes stacked in the thickness direction with piezoelectric-member layers disposed therebetween are arranged in parallel between a driving section and an output electrode.

Figure 4:
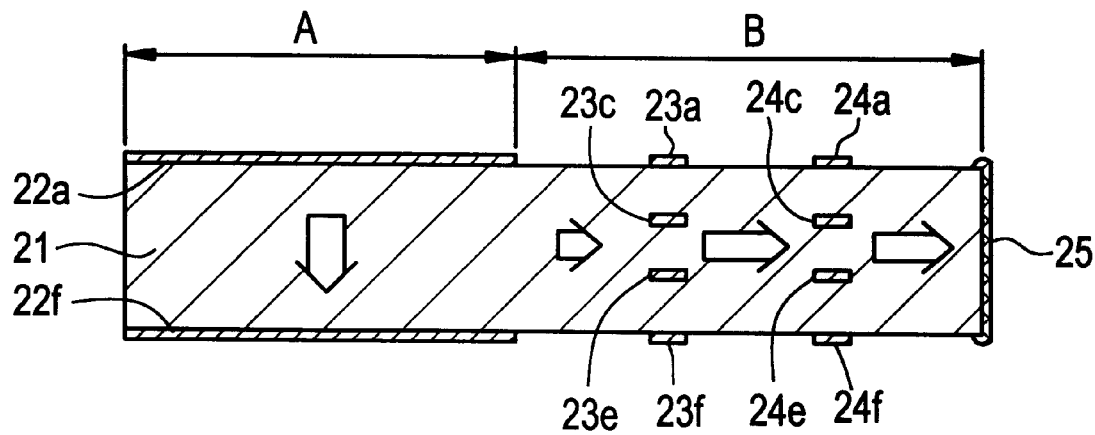
FIG. 4 is a cross section of a piezoelectric transformer according to another preferred embodiment of the present invention.

FIG. 4 is a cross section of the piezoelectric transformer according to another preferred embodiment of the invention. In FIG. 4, there is shown a piezoelectric member 21, driving electrodes 22a and 22f, electrodes 23a, 23c, 23e, 23f, 24a, 24c, 24e, and 24f disposed in a power-generating section, and a power-generating electrode 25.

The piezoelectric member is preferably polarized in the following way.

An electric field is applied between the driving electrodes 22a and 22f so that the piezoelectric member is polarized in the thickness direction until the degree of polarization reaches saturation.

Between one electrode made by electrically short-circuiting the driving electrodes 22a and 22f, and the other electrode made by electrically short-circuiting the electrodes 23a, 23c, 23e, and 23f, an electric field is applied. The piezoelectric member is polarized in the longitudinal direction to such an extent that the degree of polarization in the piezoelectric member does not reach saturation.

Between one electrode made by electrically short-circuiting the electrodes 23a, 23c, 23e, and 23f, and the other electrode made by electrically short-circuiting the electrodes 24a, 24c, 24e, and 24f, an electric field is applied. The piezoelectric member is polarized in the longitudinal direction until the degree of polarization in the piezoelectric member reaches saturation. The direction of polarization is the same as that for the polarization between one electrode made by electrically short-circuiting the driving electrodes 22a and 22f, and the other electrode made by electrically short-circuiting the electrodes 23a, 23c, 23e, and 23f. In the same way, the piezoelectric member is polarized between the electrode 25 and the electrodes 24a, 24c, 24e, and 24f until the degree of polarization reaches saturation.

Mechanical strength of the preferred embodiment shown in FIG. 4 and described above was measured for the obtained piezoelectric transformer in the same way as in the first preferred embodiment. Table 1 shows the results.

THIRD PREFERRED EMBODIMENT

In the same way as in the first preferred embodiment, a piezoelectric transformer is prepared in which a driving section is of a laminated-layer type having a plurality of electrode layers, and preferably three sets of electrodes stacked in the thickness direction with piezoelectric-member layers disposed therebetween are arranged in parallel between the driving section and a power-generating electrode.

Figure 5:
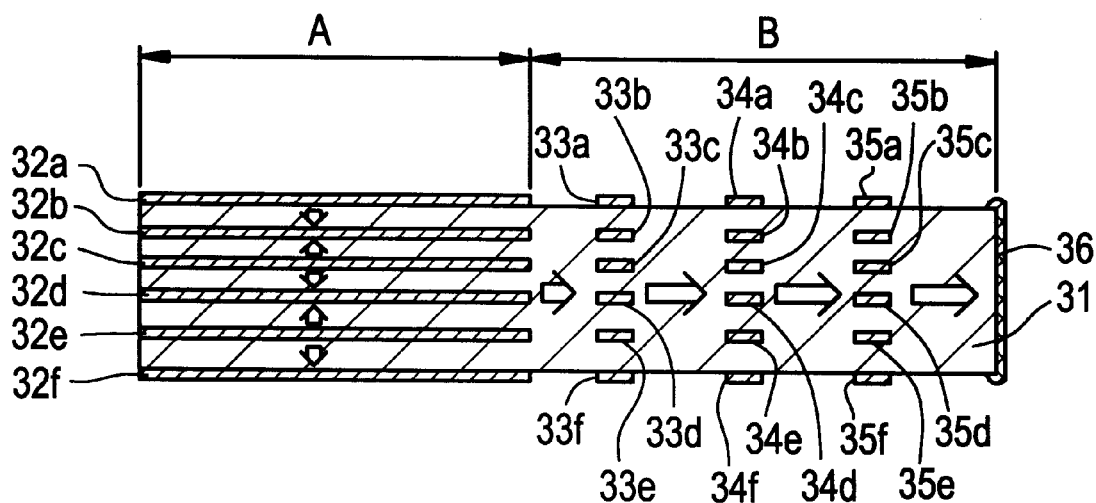
FIG. 5 is a cross section of a piezoelectric transformer according to still another preferred embodiment of the present invention.

FIG. 5 is a cross section of the piezoelectric transformer according to another preferred embodiment of the present invention. In FIG. 5, there is shown a piezoelectric member 31, driving electrodes 32a, 32b, 32c, 32d, 32e, and 32f, electrodes 33a, 33b, 33c, 33d, 33e, 33f, 34a, 34b, 34c, 34d, 34e, 34f, 35a, 35b, 35c, 35d, 35e, and 35f disposed in a power-generating section, and the power-generating electrode 36.

The piezoelectric member is preferably polarized in the following way.

Between one electrode made by electrically short-circuiting the driving electrodes 32a, 32c, and 32e, and the other electrode made by electrically short-circuiting the driving electrodes 32b, 32d, and 32f, an electric field is applied so that the piezoelectric member is polarized in the thickness direction until the degree of polarization reaches saturation.

Between one electrode made by electrically short-circuiting the driving electrodes 32a, 32b, 32c, 32d, 32e, and 32f, and the other electrode made by electrically short-circuiting the electrodes 33a, 33b, 33c, 33d, 33e, and 33f, an electric field is applied. The piezoelectric member is polarized in the longitudinal direction to such an extent that the degree of polarization in the piezoelectric member does not reach saturation.

Between one electrode made by electrically short-circuiting the electrodes 33a, 33b, 33c, 33d, 33e, and 33f, and the other electrode made by electrically short-circuiting the electrodes 34a, 34b, 34c, 34d, 34e, and 34f, an electric field is applied. The piezoelectric member is polarized in the longitudinal direction until the degree of polarization in the piezoelectric member reaches saturation. The direction of polarization is the same as that for the polarization between one electrode made by electrically short-circuiting the electrodes 32a, 32b, 32c, 32d, 32e, and 32f, and the other electrode made by electrically short-circuiting the electrodes 33a, 33b, 33c, 33d, 33e, and 33f. In the same way, the piezoelectric member was polarized between the electrodes 34a, 34b, 34c, 34d, 34e, and 34f, and the electrodes 35a, 35b, 35c, 35d, 35e, and 35f until the degree of polarization reaches saturation. The piezoelectric member is also polarized between the electrodes 35a, 35b, 35c, 35d, 35e, and 35f, and the electrode 36 until the degree of polarization reaches saturation.

Mechanical strength was measured for the piezoelectric transformer of the preferred embodiment shown in FIG. 5 in the same way as in the first preferred embodiment. Table 1 shows the results.

For comparison, a conventional piezoelectric transformer was prepared which had the same dimensions and the same electrode configuration as the piezoelectric transformer according to the third preferred embodiment and which had a uniform degree of polarization in the driving section and a uniform degree of polarization in the power-generating section.

Mechanical strength was measured for the obtained conventional piezoelectric transformer in the same way as in the first preferred embodiment. Table 1 shows the results.

TABLE 1

|  | Mean breaking strength [$\mu$] (kgf/mm$^2$) | Form factor [m] |
| --- | --- | --- |
| Transformer according to first preferred embodiment | 12.8 | 12.3 |
| Transformer according to second preferred embodiment | 16.4 | 14.6 |
| Transformer according to third preferred embodiment | 16.9 | 13.2 |
| Conventional transformer | 6.7 | 4.7 |

As shown in Table 1, the piezoelectric transformers according to the preferred embodiments of the present invention achieve about double the mean breaking strength and a greatly reduced dispersion as indicated by the form factor as compared with the conventional piezoelectric transformer. This means that the piezoelectric transformers according to the preferred embodiments of the present invention had no defects such as micro-cracks formed during polarization.

As seen in Table 1, the second and third preferred embodiments shown in FIGS. 4 and 5, respectively, achieve higher mean breaking strength than the first preferred embodiment. The reason for this improvement in the second and third preferred embodiments as compared to the first preferred embodiment is that the presence of one or more stacks of a plurality of polarization electrodes 23a–23f and 24a–24f in FIG. 4 and 33a–33f, 34a–34f and 35a–35f in FIG. 5 reduces an incline in the direction of polarization in the portion of the piezoelectric member located between the driving section and the stack of polarization electrodes located closest to the driving section. The inventors realized that an inclined polarization exists between the driving section and the polarization electrode located closest to the driving section. The inventors also realized that a more inclined polarization generates greater internal stress. Accordingly, the inventors determined that by arranging one or more stacks of electrodes between the driving section and the power generating electrode, the second preferred embodiment results in a less inclined polarization and less internal stress than the first preferred embodiment and the third preferred embodiment results in a less inclined polarization and less internal stress than the second and first preferred embodiments.

A piezoelectric transformer according to the present invention is not limited to only those preferred embodiments and may be modified in various ways within the scope of the present invention. The positions, shapes, and number of driving electrodes, the positions, shapes, and number of electrodes used for polarization, and the position and shape of a power-generating electrode can be changed as required.

In the above preferred embodiments, only a portion of the piezoelectric member located between the driving section and the electrode or electrodes closest to the driving section in the power-generating section among the electrode or electrodes disposed between the driving section and the power-generating electrode is polarized to such an extent that the degree of polarization does not reach saturation. The degree of polarization may be gradually changed in the power-generating section from the driving section to the power-generating electrode.

In the above preferred embodiments, in order to integrally form the piezoelectric transformer, a method is used in which laminated green sheets made up of a piezoelectric material are sintered. Other methods may be used such as superposition of piezoelectric-member paste in printing and fusion of sintered members.

In the above preferred embodiments, ceramic is preferably used for the piezoelectric member. Other materials such as piezoelectric resin and a composite of ceramic and piezoelectric resin may be used.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A piezoelectric transformer comprising: a piezoelectric member including a driving section and a power-generating section, the driving section including at least one driving electrode and a first portion of the piezoelectric member which is polarized in a thickness direction of the piezoelectric member and which includes a first end of the piezoelectric member, the power-generating section including at least one power-generating electrode and a portion of the piezoelectric member which is polarized in a longitudinal direction of the piezoelectric member and which includes a second end of the piezoelectric member disposed opposite to the first end, wherein at least two polarization electrodes are exposed at least in part on a surface of the piezoelectric member and are spaced from each other along a length of the piezoelectric member so as to define at least three portions within the power-generating section including a first portion located between the driving section and a first one of the at least two polarization electrodes, at least one second portion located between the at least two polarization electrodes, and a third portion located between a second one of the at least two polarization electrodes and the power-generating electrode, wherein a degree of polarization of the first portion is lower than a degree of polarization of the at least one second portion of the piezoelectric member and a degree of polarization of the at least one second portion is lower than a degree of polarization of the third portion.

2. A piezoelectric transformer according to claim 1, wherein the at least two polarization electrodes provided between the driving section and the power-generating electrode are arranged substantially perpendicularly to the direction of polarization of the portion of the piezoelectric member in the power-generating section.

3. A piezoelectric transformer according to one of claim 1, further comprising a plurality of polarization electrodes stacked in the thickness direction of the piezoelectric member and being disposed between piezoelectric layers forming the piezoelectric member and arranged in parallel between the driving section and the power-generating electrode.

4. A piezoelectric transformer according to one of claim 1, wherein the piezoelectric member is made of a ceramic material.

5. A piezoelectric transformer comprising:
a piezoelectric member including a driving section and a power-generating section having a power generating electrode, and at least two polarization electrodes exposed at least in part on a surface of the piezoelectric member and spaced from each other along a length of the piezoelectric member so as to define at least three portions within the power-generating section including a first portion located between the driving section and a first one of the at least two polarization electrodes, at least one second portion located between the at least two the polarization electrodes, and a third portion located between a second one of at least two polarization electrodes and the power-generating electrode, wherein a degree of polarization of the first portion is lower than a degree of polarization of the at least one second portion of the piezoelectric member and a degree of polarization of the second portion is lower than a degree of polarization of the third portion.

6. A piezoelectric transformer according to claim 5, further comprising a plurality of polarization electrodes being arranged in a plurality of stacks of polarization electrodes, each of the stacks of polarization electrodes being spaced from each of the other stacks of polarization electrodes in a longitudinal direction of the piezoelectric member.

7. A piezoelectric transformer according to claim 6, wherein each of the polarization electrodes of the plurality of stacks of polarization electrodes are spaced from each other in a thickness direction of the piezoelectric member.

8. A piezoelectric transformer according to claim 6, wherein the driving section includes a plurality of driving electrodes arranged in a stack such that the stack of driving electrodes are spaced from the stacks of polarization electrodes in a longitudinal direction of the piezoelectric member.

9. A piezoelectric transformer comprising:

a piezoelectric member including a driving section and a power-generating section and at least two polarization electrodes disposed within the piezoelectric member and spaced from each other along a length of the piezoelectric member so as to define at least three portions within the power-generating section including a first portion located between the driving section and a first one of the at least two polarization electrodes, at least one second portion located between the at least two polarization electrodes, and a third portion located between a second one of the at least two polarization electrodes and the power-generating electrode, a degree of polarization of the first portion is lower than a degree of polarization of the at least one second portion of the piezoelectric member and a degree of polarization of the second portion is lower than a degree of polarization of the third portion, the driving section including first and second driving electrodes and the power generating section electrode, the at least two polarization electrodes being located between the driving electrodes and the power-generating electrode.

10. A piezoelectric transformer according to claim 9, wherein the piezoelectric member includes a plurality of piezoelectric layers forming an integral member.

11. A piezoelectric transformer according to claim 9, wherein the piezoelectric member comprises a single, unitary plate member.

12. A piezoelectric transformer according to claim 9, wherein the driving section includes a portion of the piezoelectric member which is polarized in a thickness direction thereof.

13. A piezoelectric transformer according to claim 9, wherein the power-generating section includes a portion of the piezoelectric member which is polarized in a longitudinal direction thereof.

14. A piezoelectric transformer according to claim 9, wherein the driving section is located at a first end of the piezoelectric member and the power-generating section is located at a second end of the piezoelectric member disposed opposite to the first end.

* * * * *